United States Patent
Liu et al.

(10) Patent No.: US 7,250,319 B2
(45) Date of Patent: Jul. 31, 2007

(54) METHOD OF FABRICATING QUANTUM FEATURES

(75) Inventors: Wei Liu, San Jose, CA (US); Lawrence West, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 181 days.

(21) Appl. No.: 10/825,826

(22) Filed: Apr. 16, 2004

(65) Prior Publication Data

US 2005/0233487 A1 Oct. 20, 2005

(51) Int. Cl.
*H01L 21/00* (2006.01)

(52) U.S. Cl. .................................. 438/39; 438/717

(58) Field of Classification Search ............... 438/48, 438/555, 671, 717, 942, 947, 950, 962, 39–40; 430/314, 316, 321; 716/20–21
See application file for complete search history.

(56) References Cited

U.S. PATENT DOCUMENTS

| 6,366,730 | B1 * | 4/2002 | Cappuzzo et al. .......... 385/129 |
| 6,989,333 | B2 * | 1/2006 | Watanabe et al. ........... 438/725 |
| 2004/0005723 | A1 | 1/2004 | Empedocies et al. |
| 2004/0028684 | A1 | 2/2004 | Empedocies |
| 2004/0095658 | A1 | 5/2004 | Buretea et al. |

* cited by examiner

*Primary Examiner*—Thanhha S. Pham
(74) *Attorney, Agent, or Firm*—Patterson & Sheridan LLP

(57) ABSTRACT

A method of fabricating quantum features on a substrate from a layer of material selected from materials identified in the III-V periodic groups (e.g., silicon (Si), $I_nP$, Si—Ge, and the like) uses sequentially two patterned masks, each mask includes an elongated mask pattern disposed substantially orthogonal to the elongated pattern of the other mask. In one embodiment, the method forms on a semiconductor wafer a plurality of quantum dots having topographic dimensions of about 30 nm or less. In another embodiment, the invention may be halted after a first etch process to form quantum lines.

57 Claims, 12 Drawing Sheets

METHOD OF FABRICATING QUANTUM FEATURES

BACKGROUND OF THE INVENTION

1. Field of the Invention

The present invention generally relates to a method for fabricating devices on semiconductor substrates. More specifically, the present invention relates to a method of fabricating quantum features on a semiconductor substrate.

2. Description of the Related Art

Microelectronic devices are generally fabricated on a semiconductor substrate as integrated circuits wherein various conductive layers are interconnected to one another to facilitate propagation of electronic signals within the device. An example of such a device is a storage element in silicon nano-crystal based nonvolatile memories.

In such memories, the charge is stored in an array of spaced apart small islands (or quantum dots) of silicon. The array of such quantum dots forms a floating gate that may be embedded in a gate dielectric of a gate structure of a field effect transistor. Generally, about 500-700 quantum dots are used to form one floating gate. A quantum dot is generally a silicon structure having topographic dimensions on order of 10's of nanometers.

Quantum features are also used as semiconductor lasers. Recently, such quantum dots, when released from the substrate, have also found a use in non-semiconductor applications, for example, as carriers of precursors, inhibitors, and the like in chemical reactions performed between liquid phase reactants.

In a floating gate field effect transistor fabrication process, a lithographically patterned mask is used during etch and deposition processes that form the gate structure of the transistor. As topographic dimensions of transistors continue decreasing in advanced integrated circuits, conventional lithographic techniques become unable to accurately define components of the gate structure and, specifically, the quantum dots of the floating gate of the gate structure of ever-smaller transistors.

Therefore, there is a need in the art for an improved method of fabricating silicon quantum dots and other forms of quantum features.

SUMMARY OF THE INVENTION

A method of fabricating quantum features from a layer of material selected from materials identified in the III-V periodic groups (e.g., silicon (Si), and the like) on a substrate is provided. The features may include lines, dots and the like. In one embodiment, a method of fabrication quantum features from a layer of material selected from materials identified in the III-V periodic groups includes the steps of etching an elongated structure in the material through a first hard mask, then etching the elongated structure through a second hard mask having mask pattern oriented orthogonal to an orientation of the elongated structures. In one embodiment, the method may be used to form a plurality of quantum dots on a semiconductor wafer having topographic dimensions of about 30 nm or less and disposed about 110 nm or greater apart from one another. In another embodiment, the process etches an elongated structure through a first-hand mask to form quantum lines.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

It is to be noted, however, that the appended drawings illustrate only exemplary embodiments of this invention and are therefore not to be considered limiting of its scope, for the invention may admit to other equally effective embodiments.

DETAILED DESCRIPTION

The present invention is a method of fabricating quantum features on a substrate (e.g., semiconductor substrate) using two patterned masks. Each patterned mask comprises at least one elongated structure formed through the mask (e.g., mask pattern, such as an aperture, a slot, a line, a wall, and the like) disposed substantially orthogonal to portions of the other patterned mask. The invention may be used to form deep sub-micron quantum dots (e.g., quantum dots having topographic dimensions of about 30 nm or less) from a layer of material selected from materials identified in the III-V periodic groups, such as silicon (Si), and the like.

Figure 1A:
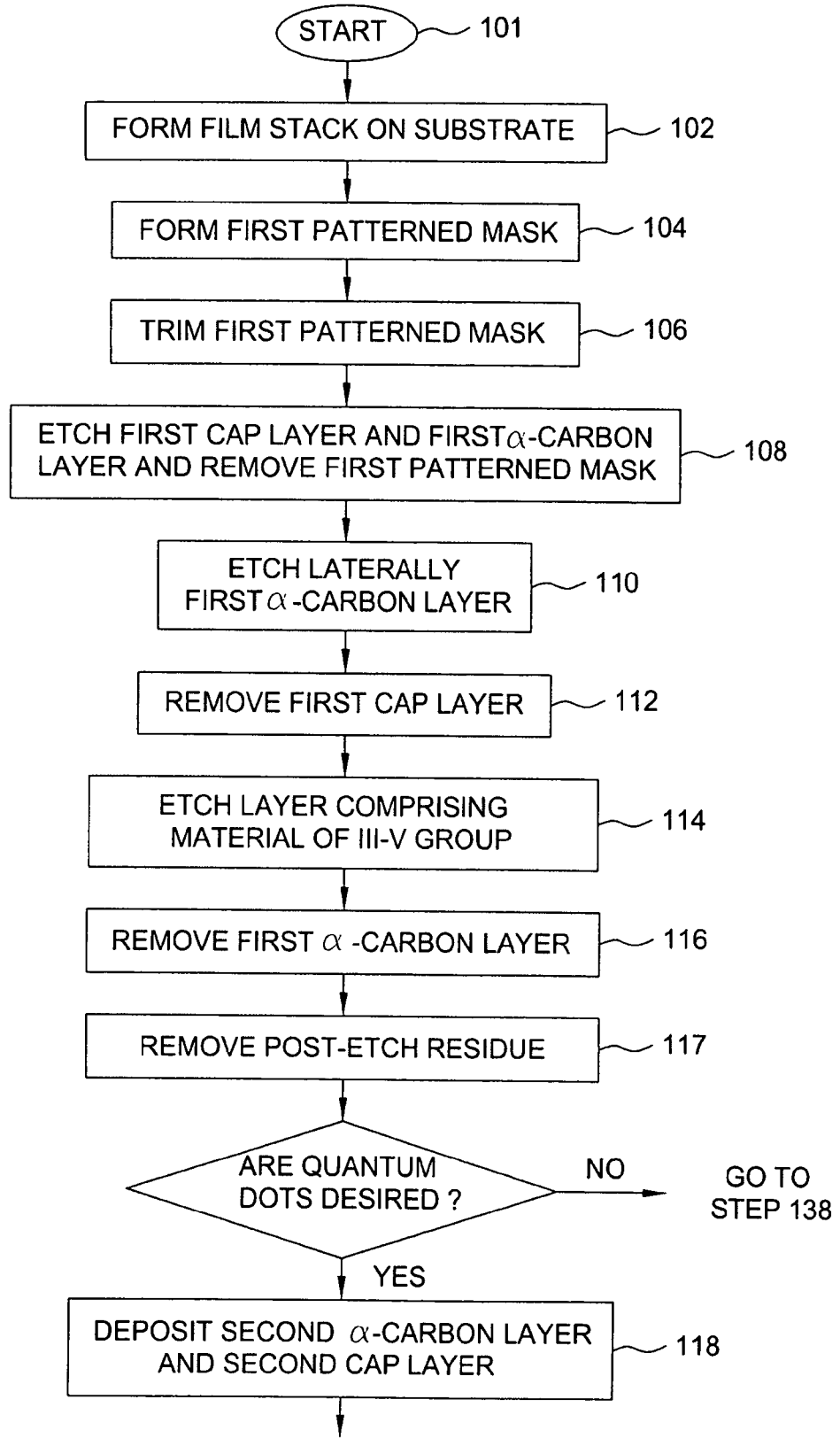
FIGS. 1A-1B depict a flow diagram of a method of fabricating quantum features in accordance with one embodiment of the present invention.
Figure 1B:
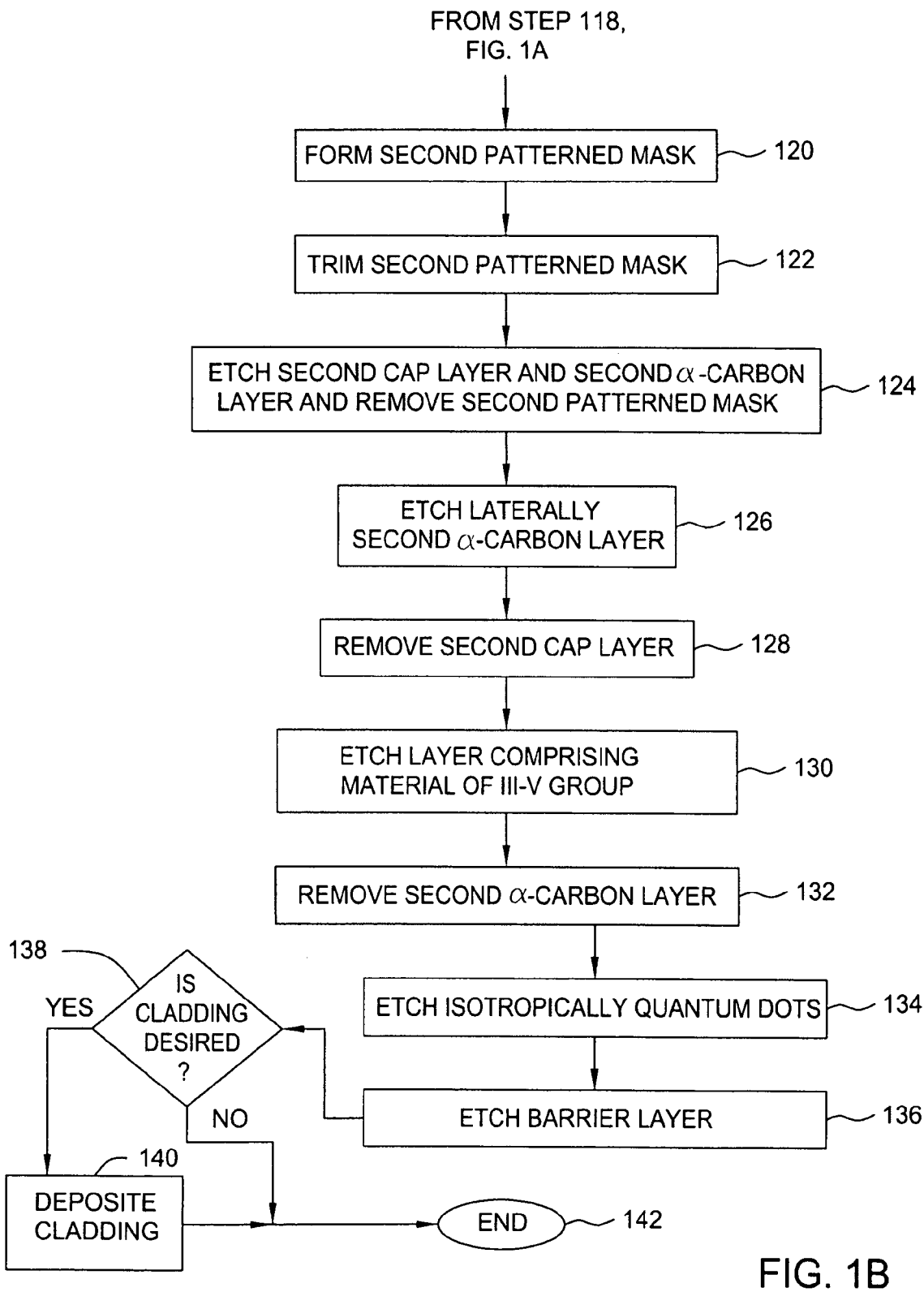
Figure 2A:
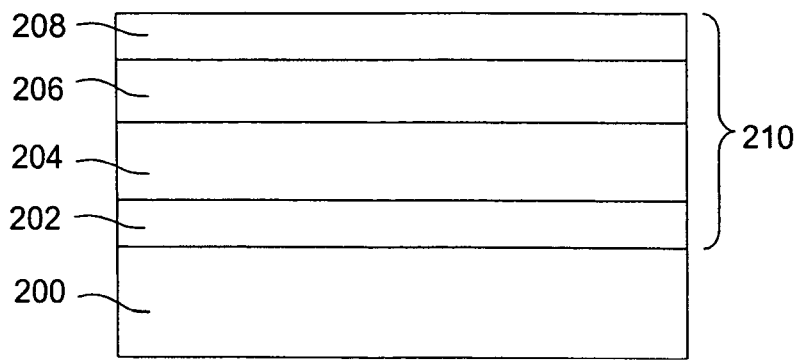
FIGS. 2A-2U depict a series of schematic, cross-sectional and top plan views of a substrate having the quantum dots fabricated in accordance with the method of FIGS. 1A-1B.

FIG. 1 depicts a flow diagram of one embodiment of a method 100 for fabricating quantum features (e.g., either quantum dots or lines). FIGS. 2A-2U depict a series of schematic, cross-sectional and top plan views of a substrate having a film stack used for fabricating quantum dots in accordance with the method 100. The cross-sectional views in FIGS. 2A-2U relate to individual processing steps of the method 100. Cross-sectional views in FIGS. 2N-2R are taken along a line L-L in FIG. 2M. Sub-processes and lithographic routines (e.g., exposure and development of photoresist, wafer cleaning procedures, and the like) are well known in the art and, as such, are not shown in FIG. 1 and FIGS. 2A-2U. The images in FIGS. 2A-2U are not depicted to scale and are simplified for illustrative purposes. To best understand the invention, the reader should simultaneously refer to FIG. 1 and FIGS. 2A-2U.

The method 100 starts at step 101 and proceeds to step 102 when a film stack 210 is formed on a substrate 200 (FIG. 2A), such as a silicon (Si) wafer, and the like. The film stack 210 generally comprises a first cap layer 208, a first hard mask layer 206, a quantum dot layer 204, and a barrier layer 202.

The first cap layer 208 generally is a layer of an inorganic dielectric material. The first cap layer 208 is generally formed of material that is resistant to the etchant used to etch the first hard mask layer 206. Additionally, the material and thickness of the first cap layer 208 are selected such that the layer 208 can be utilized as an antireflective coating (ARC) for a photoresist etch mask when the mask is formed on such a layer. In one exemplary embodiment, the first cap layer 208 is formed of silicon dioxide ($SiO_2$) or silicon oxynitride (SiON), and the like.

The first hard mask layer 206 is generally formed of material that may be selectively etched using the first cap layer 208 as an etch mask. In one exemplary embodiment, the first hard mask layer 206 may be formed from α-carbon (i.e., amorphous carbon), and the like. In an alternate embodiment, the first cap layer 208 and first hard mask layer 206 may be component layers of Advanced Patterning Film™ (APF) available from Applied Materials, Inc. of Santa Clara, Calif.

The quantum dot layer 204 may be formed from at least one material selected from materials identified in the III-V periodic groups (e.g., silicon (Si), indium phosphide InP, and the like), while the barrier layer 202 may generally be a dielectric layer formed of materials, such as silicon dioxide, silicon carbide (SiC), and the like. In other embodiments, the quantum dot layer 204 may be formed of silicon-germanium (Si—Ge). Furthermore, the substrate may be formed of a material other than silicon, such as gallium arsenide (GaAs).

The layers of the film stack 210 can be formed using any conventional thin film deposition technique, for example, atomic layer deposition (ALD), physical vapor deposition (PVD), chemical vapor deposition (CVD), plasma enhanced CVD (PECVD), and the like. Fabrication of the gate structure of a field effect transistor may be performed using the respective processing reactors of the CENTURA® and for ENDURA® systems, among other semiconductor wafer processing systems available from Applied Materials, Inc., of Santa Clara, Calif.

Figure 2B:
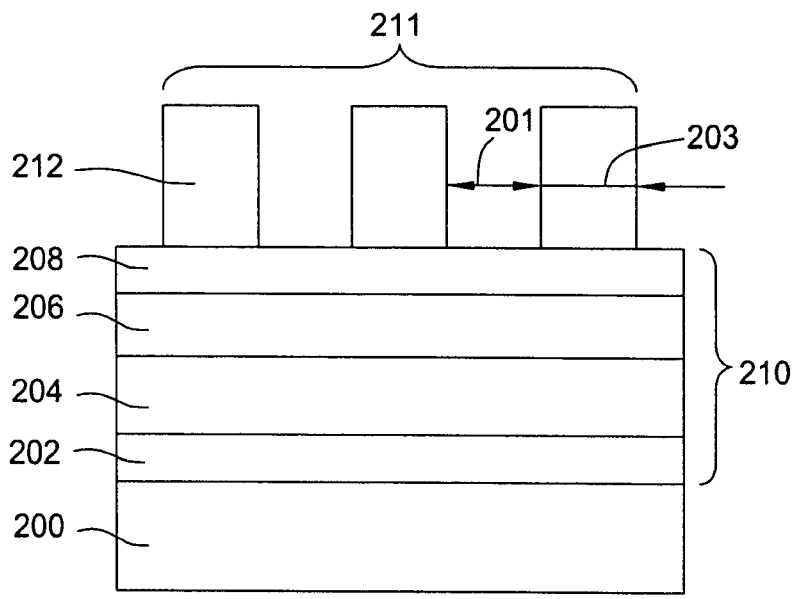
Figure 2C:
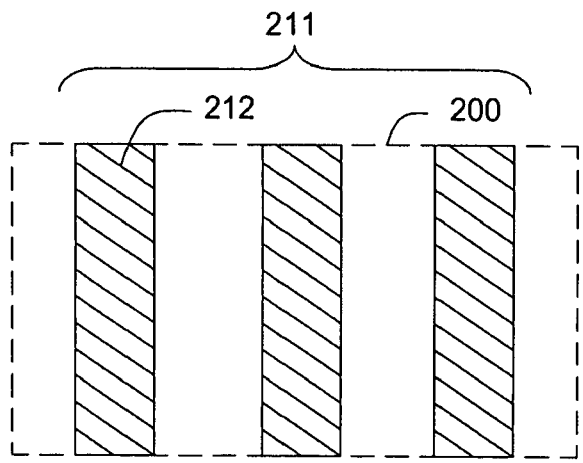

At step 104, a first patterned mask 211 is formed on the substrate 200 (FIGS. 2B and 2C. FIG. 2B depicts a cross-sectional view, and FIG. 2C depicts a top plan of the substrate 200, respectively. The first patterned mask 211 generally is a photoresist mask comprising at least one elongated structure 212 formed through the mask (three structures 212 are shown in FIGS. 2B, 2C), such as an aperture, a slot, a line, a wall, and the like. The elongated structures 212 are separated from one another using spaces (or gaps) 201 and are disposed substantially parallel to one another. Generally, the first patterned mask 211 comprises a plurality of such elongated structures having a common orientation.

The first photoresist mask 211 may be fabricated using a lithographic process when a pattern of the feature to be formed (e.g., elongated structure 212) is optically transferred into a layer of photoresist. The photoresist is then developed, unexposed portions of the photoresist are removed, and the remaining photoresist forms the patterned mask 211. During the lithographic process, the first cap layer 208 is utilized as an ARC layer that controls reflection of the light used to expose the photoresist. In one exemplary embodiment, the lithographic process forms the elongated structures 212 having smallest widths 203 of about 100 nm.

Processes of forming the first patterned mask 211 are described, for example, in commonly assigned U.S. patent application Ser. No. 10/218,244, filed Aug. 12, 2002, which is incorporated herein by reference.

Figure 2D:
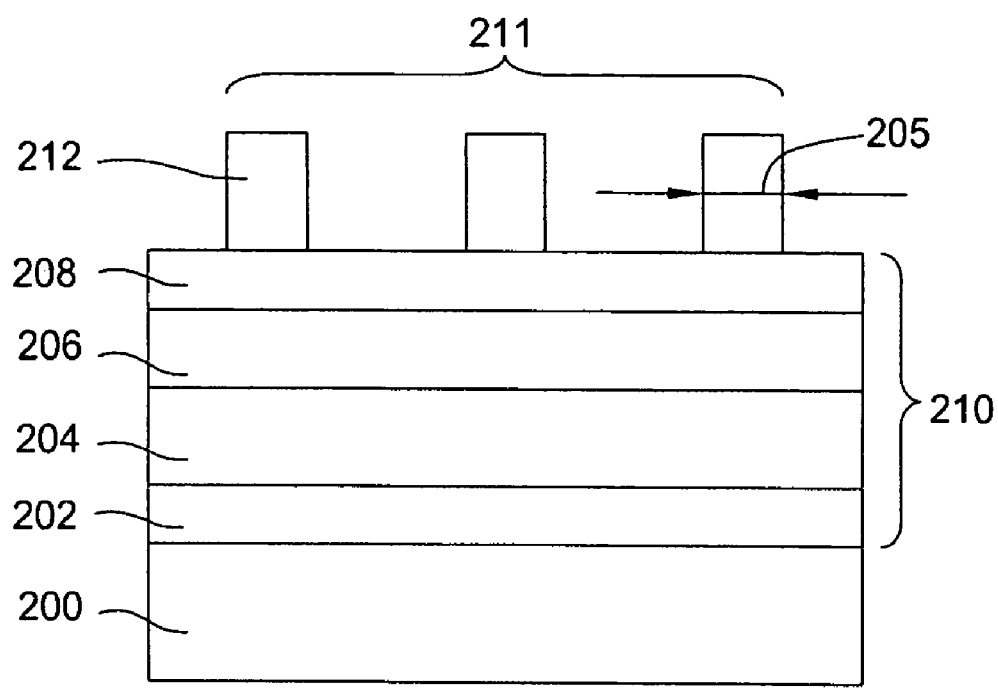

At step 106, the first photoresist mask 211 is trimmed to reduce the width 203 of the elongated structure 212 to a pre-determined width 205 (FIG. 2D). In one exemplary embodiment, the trimming process is an isotropic plasma process that uses a gas mixture comprising hydrogen bromide (HBr), oxygen ($O_2$), and a diluent gas, such argon (Ar), neon (Ne), and the like. After trimming, a height of the elongated structures 212 also decreases, as illustratively shown in FIG. 2D. However, in some applications, there is no need in reducing the width 203 and, as such, step 106 is considered optional.

Step 106 can be performed using an etch reactor, such as a Decoupled Plasma Source (DPS) II etch reactor, available from Applied Materials, Inc. The DPS II etch reactor (discussed in reference to FIG. 3 below) uses an inductive source (i.e., antenna) to produce a high-density plasma and may control a substrate temperature in a range from about 20 to 350 degrees Celsius. To determine the endpoint of an etch process, the DPS II etch reactor may use an endpoint detection system to monitor plasma emissions at a particular wavelength, control of process time, laser interferometery, and the like.

In one illustrative embodiment, the first photoresist mask 211 is trimmed using the DPS II etch reactor by providing hydrogen bromide (HBr) at a rate of 2 to 200 sccm, oxygen ($O_2$) at a rate of 5 to 100 sccm (corresponds to a $HBr:O_2$ flow ratio ranging from 1:10 to 10:1), argon (Ar) at a rate of 10 to 200 sccm, applying power to an inductively coupled antenna between 200 to 1000 W, applying a cathode bias power between 0 and 300 W, and maintaining a pedestal temperature between 0 and 80 degrees Celsius at a pressure in the process chamber between 2 and 30 mTorr. One illustrative process provides HBr at a rate of 60 sccm, $O_2$ at a rate of 28 sccm (i.e., a $HBr:O_2$ flow ratio of about 2:1), Ar at a rate of 20 sccm, applies 500 W of power to the antenna, 20 W of a bias power, maintains a pedestal temperature of 50 degrees Celsius, and a pressure of 4 mTorr. Such a process provides etch selectivity for photoresist (mask 211) over silicon oxynitride (layer 208) of at least 10:1. Such a process may reduce the width of the elongated structures 212 from about 100 nm (width 203) to about 60 nm (width 205).

Figure 2E:
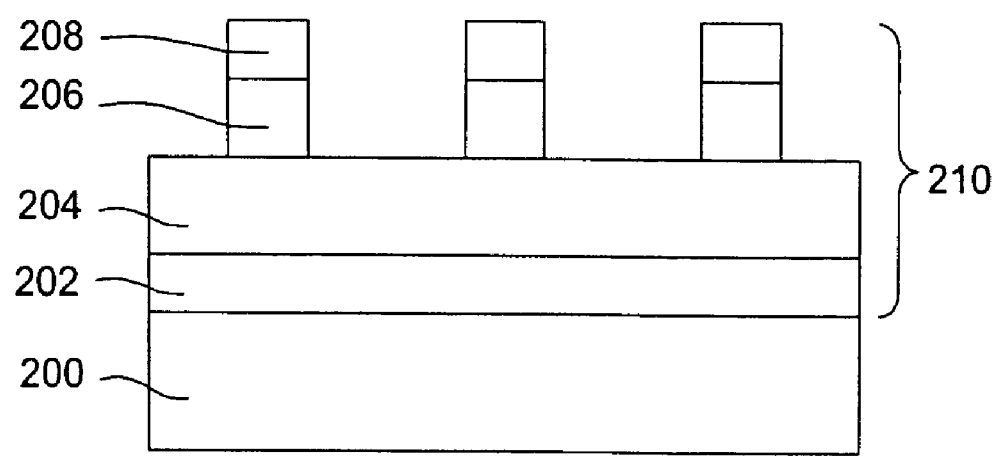

At step 108, the first cap layer 208 and first hard mask layer 206 are etched and the first photoresist mask 211 (i.e., elongated structures 212) is stripped (FIG. 2E). Step 108 comprises three periods that are performed in-situ. During a first period, the first cap layer 208 is etched using a plasma comprising a gas mixture of carbon tetrafluoride ($CF_4$) and argon (Ar). During a second period, the first hard mask layer 206 is etched using a plasma comprising a gas mixture of hydrogen bromide (HBr), oxygen ($O_2$), and argon (Ar). During a third period, the first photoresist mask 211 is stripped. In one embodiment, the second and third periods use the same process recipe.

In one illustrative embodiment, during the first period, the first cap layer 208 comprising silicon oxynitride (SiON) is etched using a DPS II etch reactor by providing tetrafluoride ($CF_4$) at a rate of 20 to 200 sccm, argon (Ar) at a rate of 20 to 200 sccm (i.e., a $CF_4:Ar$ flow ratio ranging from 1:10 to 10:1), applying power to an inductively coupled antenna between 200 to 1500 W, applying a cathode bias power between 20 and 150 W, and maintaining a pedestal temperature between 0 and 80 degrees Celsius at a pressure in the process chamber between 2 and 20 mTorr. One illustrative process provides $CF_4$ at a rate of 120 sccm, Ar at a rate of 120 sccm (i.e., a $CF_4:Ar$ flow ratio of about 1:1), applies 360 W of power to the antenna, 60 W of a bias power, and a pressure of 4 mTorr. The process provides etch selectivity for silicon oxynitride (layer 208) over photoresist (mask 211) of at least 3:1.

In this embodiment, during the second and third periods, the first hard mask layer 206 comprising α-carbon is etched, as well as the first photoresist mask 211 is stripped, by providing hydrogen bromide (HBr) at a rate of 20 to 200 sccm, oxygen ($O_2$) at a rate of 10 to 40 sccm (i.e., a $HBr:O_2$ flow ratio ranging from 1:2 to 20:1), and argon (Ar) at a rate of 20 to 200 sccm, applying power to an inductively coupled antenna between 200 to 1500 W, applying a cathode bias power between 50 and 200 W, and maintaining a pedestal temperature between 0 and 80 degrees Celsius at a pressure in the process chamber between 2 and 20 mTorr. One illustrative process provides HBr at a rate of 60 sccm, $O_2$ at a rate of 26 sccm, (i.e., a HBr:$O_2$ flow ratio of about 2.3:1), and Ar at a rate of 60 sccm, applies 600 W of power to the antenna, 60 W of a bias power, and a pressure of 4 mTorr. During the second period, the process provides etch selectivity for α-carbon (layer 206) over photoresist (mask 211) of at least 2:1. During the third period, the process provides etch selectivity for photoresist over silicon (layer 204) and silicon oxynitride (layer 208) of at least 100:1 and 40:1, respectively.

Figure 2F:
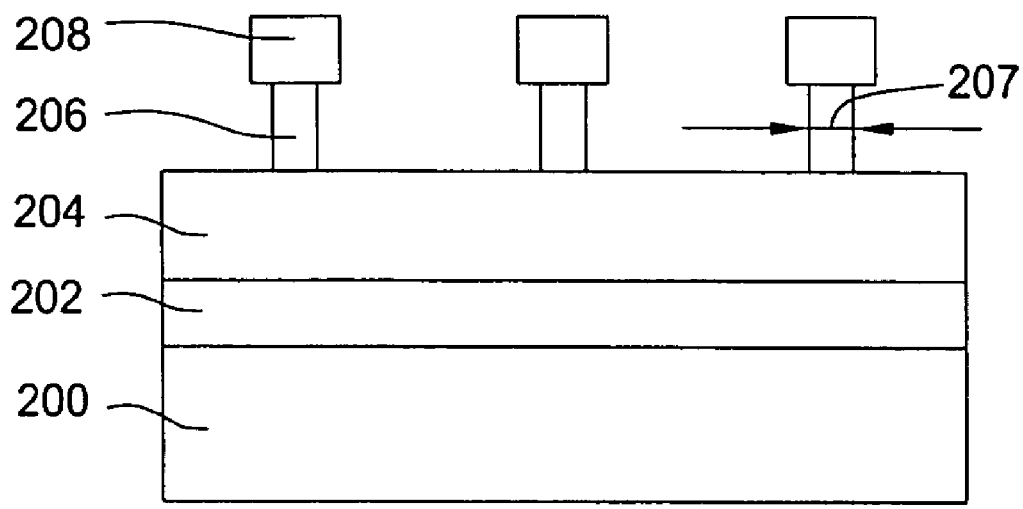

At step 110, the first hard mask layer 206 is laterally etched (FIG. 2F). Such lateral etch process is generally an isotropic plasma etch process. In one illustrative embodiment, to etch the α-carbon layer 206, step 110 may use a process similar to the process described above in reference to step 106. In an optional embodiment, such a process may use an increased $O_2$ flow rate to include an isotropic etch component. In one exemplary embodiment, step 110 reduces the width of the layer 206 from about 60 nm (width 205) to about 30 nm or less (width 207).

Figure 2G:
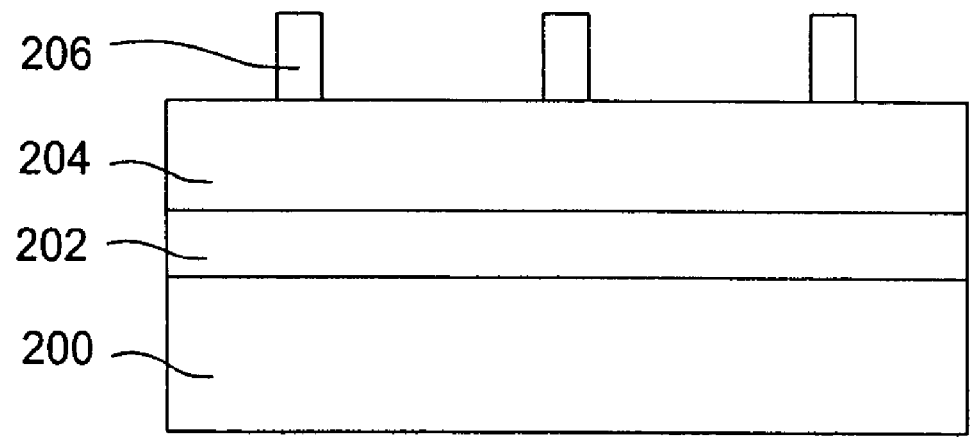

At step 112, the first cap layer 208 is removed (FIG. 2G). To remove the silicon oxynitride layer 208, step 112 may perform a wet etch process that uses, e.g., a solution comprising hydrogen fluoride (HF). In one exemplary embodiment, the solution comprises hydrogen fluoride and ammonium fluoride in a ratio, by volume, of about 1:6 and deionized (DI) water. In a further embodiment, the solution may additionally comprise, by volume, between 0.5 and 15% of at least one of nitric acid ($HNO_3$) and hydrogen chloride (HCl). Such a process may use batch wafer processing, as well as be enhanced using an ultrasonically powered bath or other industry-standard removal processes.

Figure 2H:
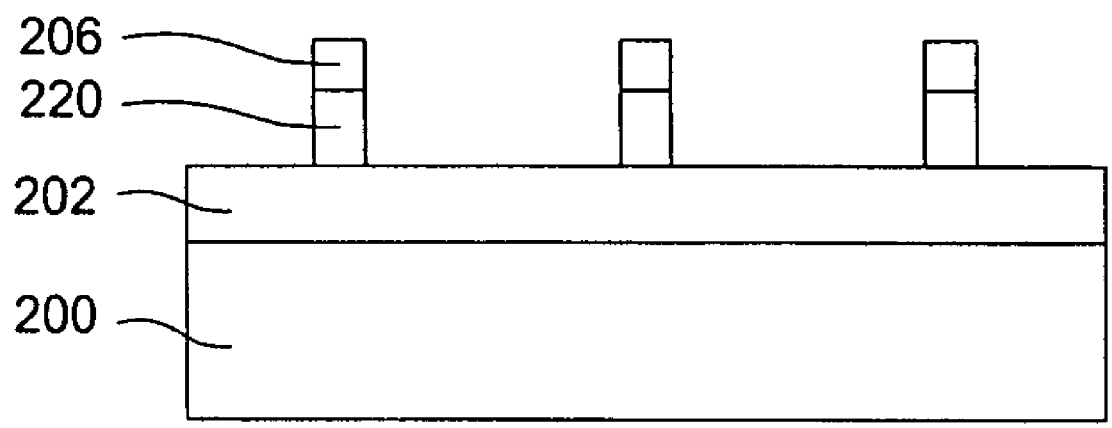

At step 114, the quantum dot layer 204 is etched (FIG. 2H). Step 114 uses the first hard mask layer 206 as an etch mask and may use the barrier layer 202 as an etch stop layer. Alternatively, optical emission endpoint can be used to signal the end of etching the layer 204. The remaining portions of the quantum dot layer 204 forms elongated features 220 (shown in a cross-sectional view in FIG. 2H and in top plan view in FIG. 2J below). To etch the quantum dot layer 204, step 114 may perform, e.g., a plasma etch process that uses a gas mixture comprising at least one of chlorinated/brominated/fluorinated gases, such as chlorine ($Cl_2$), hydrogen bromide (HBr), carbon tetrafluoride ($CF_4$), and the like, as well as an optional additive gas, such as nitrogen ($N_2$), a mixture of helium (He) and oxygen ($O_2$), or He—$O_2$, and the like.

In one illustrative embodiment, the quantum dot layer 204 comprising silicon is etched using the DPS II etch reactor by providing carbon tetrafluoride ($CF_4$) at a rate 20 to 100 sccm, hydrogen bromide (HBr) at a rate 50 to 400 sccm (i.e., a $CF_4$:HBr flow ratio ranging from 1:20 to 2:1), chlorine ($Cl_2$) at a rate of 20 to 200 sccm, He—$O_2$ at a rate of 0 to 30 sccm, applying power to an inductively coupled antenna between 200 to 1500 W, applying a cathode bias power between 20 to 200 W and maintaining a pedestal temperature between 0 and 80 degrees Celsius at a pressure in the process chamber between 2 and 40 mTorr. One illustrative process provides $CF_4$ at a rate of 35 sccm, HBr at a rate of 125 sccm (i.e., a $CF_4$:HBr flow ratio of about 1:3.6), $Cl_2$ at a rate of 80 sccm, He—$O_2$ at a rate of 8 sccm, applies 400 W of power to the antenna, 80 W of a bias power, maintains a pedestal temperature of 65 degrees Celsius, and a pressure of 4 mTorr. Such a process provides etch selectivity for silicon (layer 204) over α-carbon (layer 206) of at least 4:1.

Figure 2I:
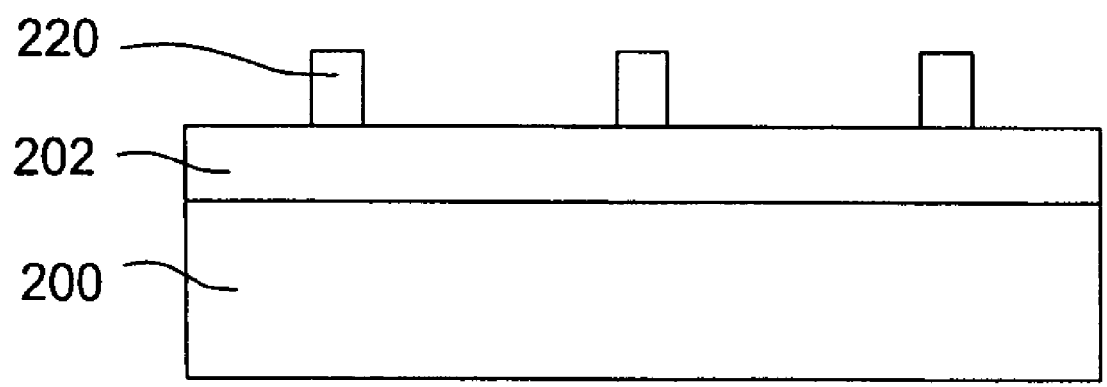
Figure 2J:
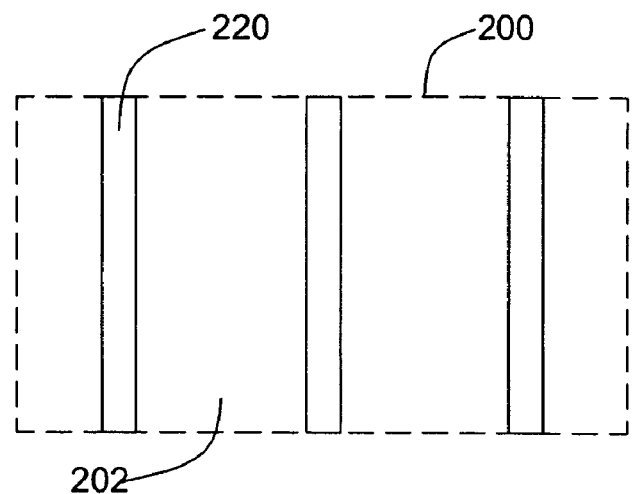
Figure 2K:
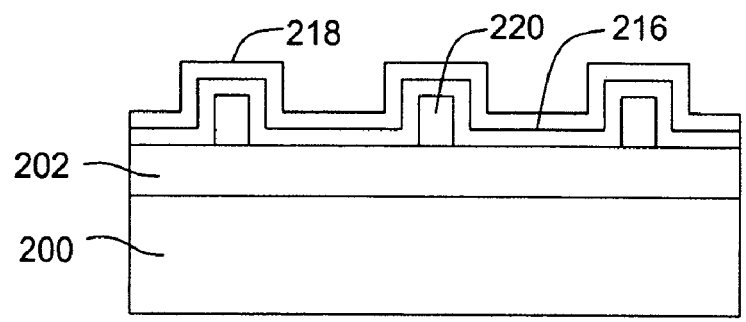

At step 116, the first hard mask layer 206 is removed. The cross-sectional and top plan views of the substrate 200 having the elongated features 220 (e.g., silicon elongated structures) formed on the barrier layer 202 are depicted in FIG. 2I and FIG. 2J, respectively. In one exemplary embodiment, to remove the α-carbon layer 206, step 116 may use the process described above in reference to step 106.

At step 117, the substrate 200 undergoes a post-etch residue (e.g., $SiO_2$ residue) cleaning process. In one embodiment, the cleaning process is performed by immersing the substrate 200 in a solution of hydrogen fluoride and deionized water that comprises, by volume, about 1% of hydrogen fluoride. The method may be optionally stopped at this point, wherein quantum lines have been formed. Such quantum lines may find use as lasers and other quantum components.

At step 116, the first hard mask layer 206 is removed. The cross-sectional and top plan views of the substrate 200 having the elongated features 220 (e.g., silicon elongated structures) formed on the barrier layer 202 are depicted in FIG. 2I and FIG. 2J, respectively. In one exemplary embodiment, to remove the α-carbon layer 206, step 116 may use the process described above in reference to step 106. The elonaated features 220 have a distance about 110 nm or greater from one another.

Figure 2L:
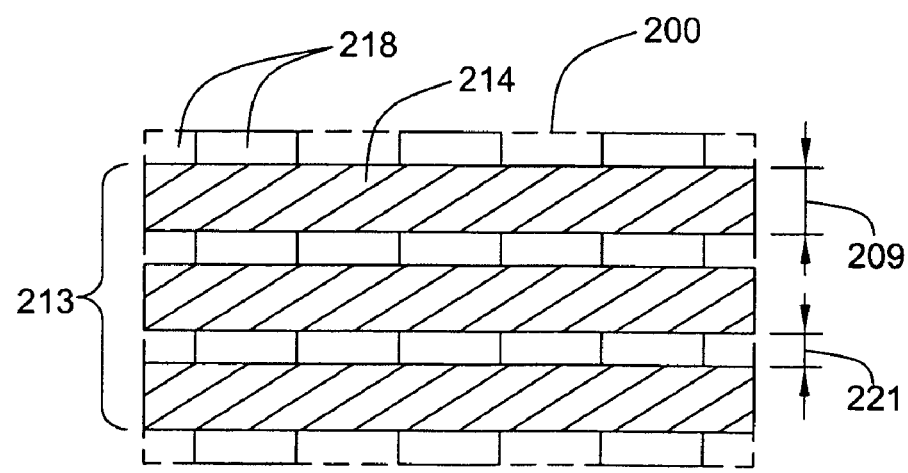

At step 120, a second patterned mask 213 is formed on the substrate 200. A top plan view of the substrate 200 having the second patterned mask 213 is shown in FIG. 2L. The second patterned mask 213 is generally a photoresist mask that may be formed using same processes as described above in reference to the first photoresist mask 211. The second patterned mask 213 comprises at least one elongated structure 214 formed through the mask (three structures 214 are shown in FIG. 2L), such as an aperture, a slot, a line, a wall, and the like, having a directional orientation different than the elongated structures 200. In one embodiment, the orientation between the structures 200, 214 is orthogonal. The elongated structures 214 are separated from one another using spaces (or gaps) 221 and are disposed substantially parallel to one another. Generally, the second patterned mask 213 comprises a plurality of such elongated structures that may be formed using the lithographic process to smallest widths 209 of about 100 nm.

Figure 2M:
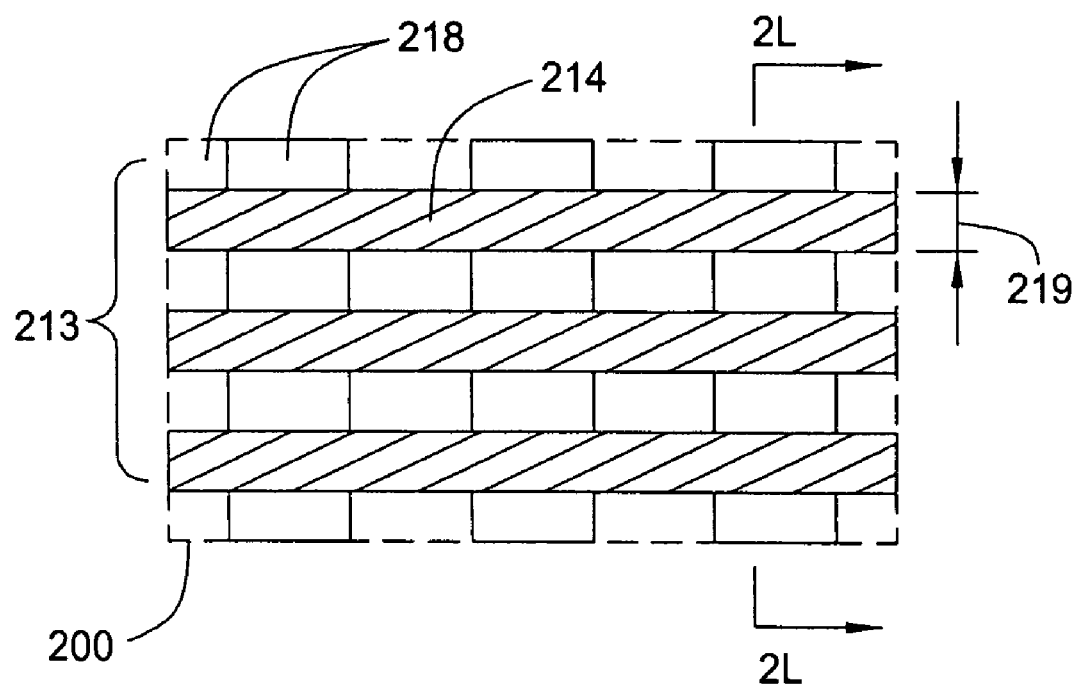

At step 122, the second patterned mask 213 is optionally trimmed to reduce width of the elongated structures 214 to a pre-determined width 219 (FIG. 2M). In one application, the widths 219 and 205 are approximately equal to one another. In one exemplary embodiment, step 122 trims the α-carbon second patterned mask 213 using the process described above in reference to step 106 and forms the structures 214 having the smallest widths 219 of about 60 nm. Referring to FIGS. 2M-2R below, the cross-sectional views are taken along a line 2N-2N in FIG. 2M.

Figure 2N:
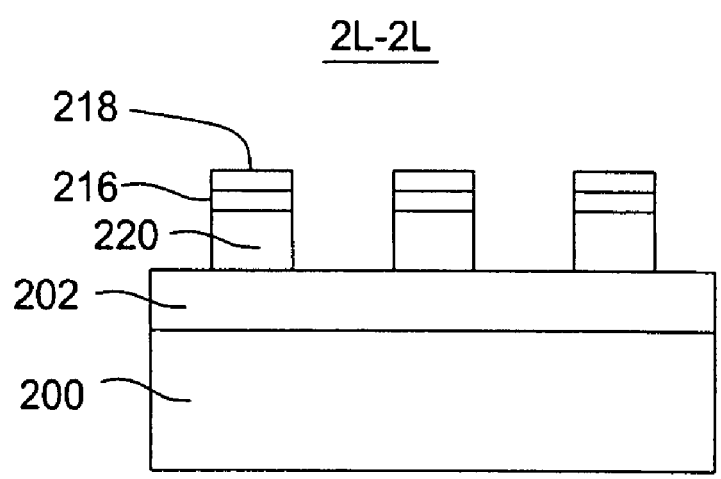
Figure 2O:
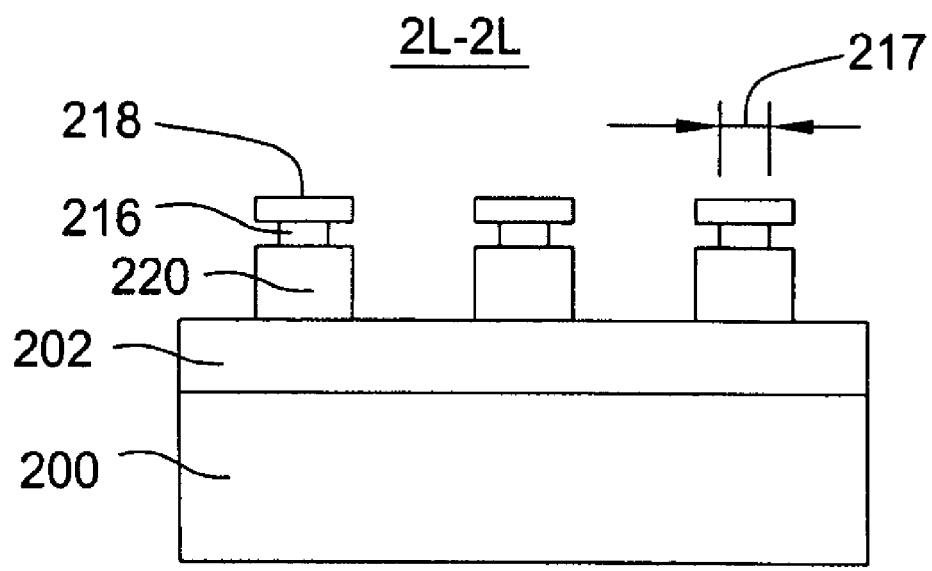
Figure 2P:
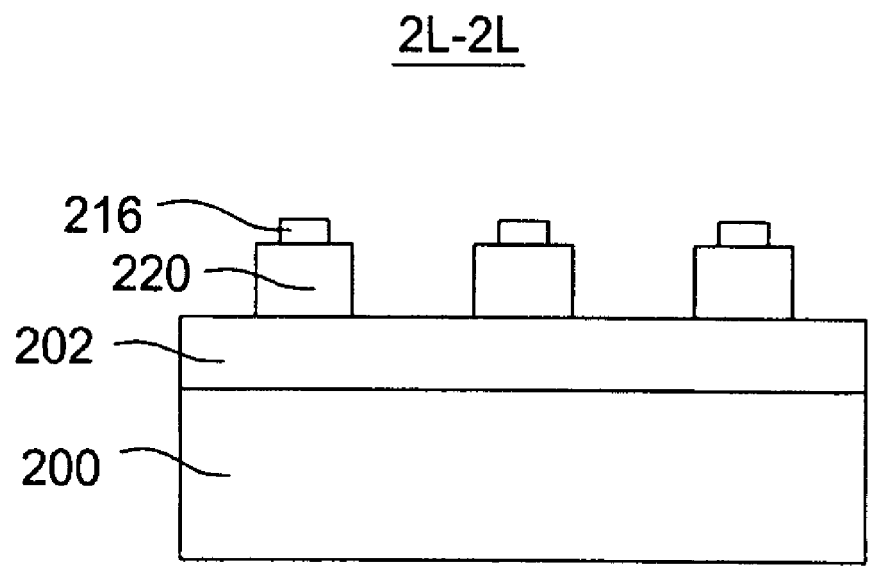

At step 124, the second cap layer 218 and second hard mask layer 216 are etched and, contemporaneously, the second photoresist mask 211 (i.e., elongated structures 212) is stripped (FIG. 2N). Step 124 may use the barrier layer 202 as an etch stop layer. In one exemplary embodiment, step 124 etches the silicon oxynitride second hard mask layer 216 using the process described above in reference to step 108 that, however, may have prolonged overetch period to remove residue (not shown) from sidewalls of the elongated structures 212.

At step 126, the α-carbon second hard mask layer 216 layer is laterally etched using, e.g., the process described above in reference to step 110 (FIG. 2O). In one exemplary embodiment, step 126 reduces the smallest width of the layer 216 from about 60 nm (width 219) to about 30 nm or less (width 217).

At step 128, the silicon oxynitride second cap layer 218 is removed (FIG. 2P) using, e.g., the process described above in reference to step 112.

Figure 2Q:
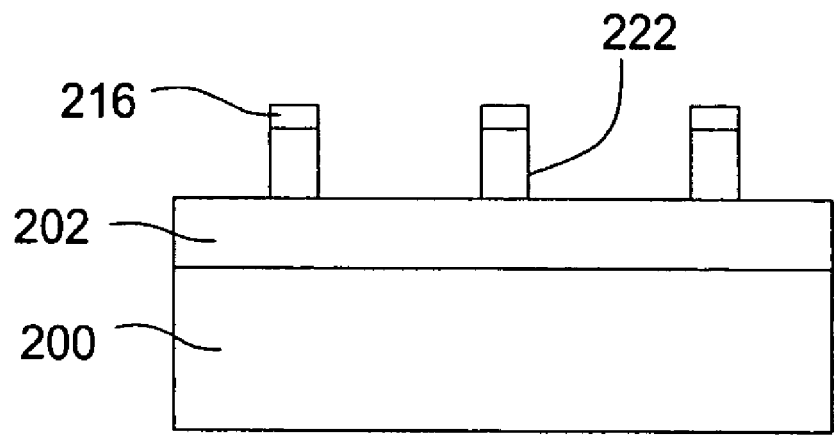

At step 130, the elongated features 220 are etched (FIG. 2Q). Step 130 uses the second hard mask 216 as an etch mask and may use the barrier layer 202 as an etch stop layer. The remaining portions of the quantum dots layer form a plurality of quantum dots 222 wherein each such dot has topographic dimensions of about 30 nm. Selectively choosing the gaps 201 and 221 between the elongated structures 212 and 214, spaces 223 and 225 between adjacent quantum dots 222 may be fabricated in a range from about 110 nm or greater. Minimal widths of the spaces are limited only by capabilities of the lithographic patterning processes used to form the patterned masks 211 and 213. In one exemplary embodiment, step 130 uses the process described above in reference to step 114 to etch silicon features 220.

Figure 2R:
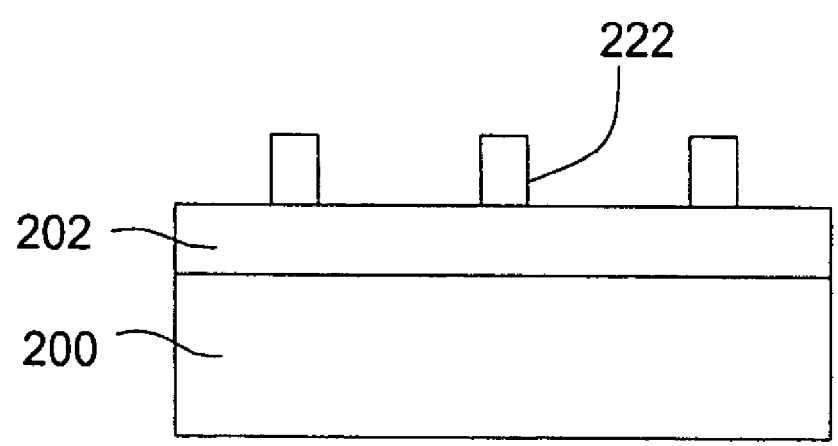
Figure 2S:
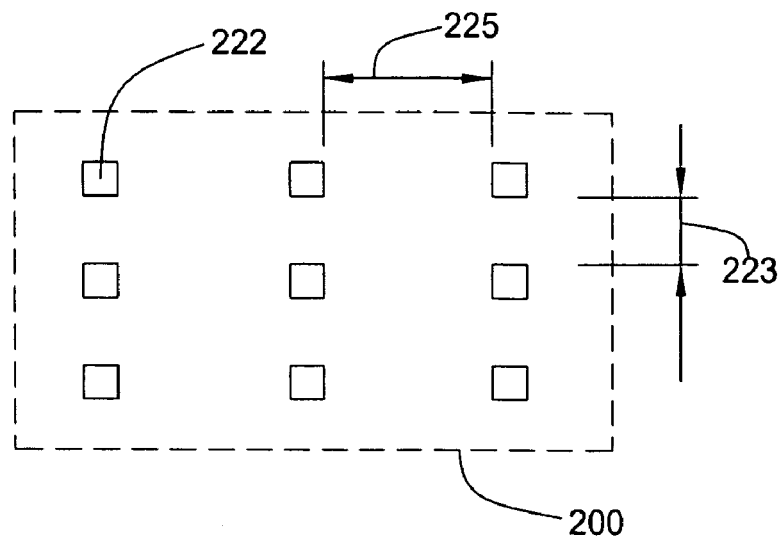
Figure 2T:
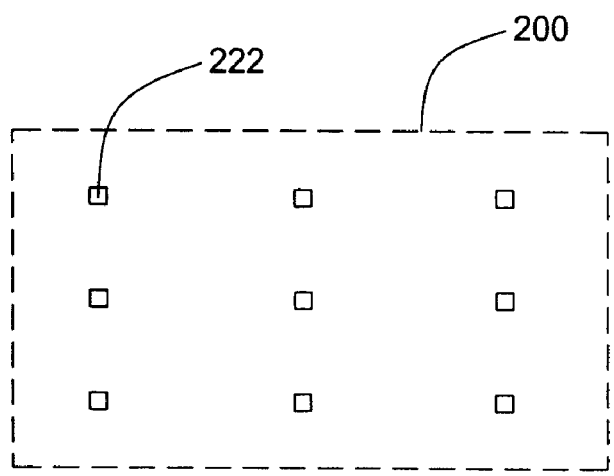
Figure 2U:
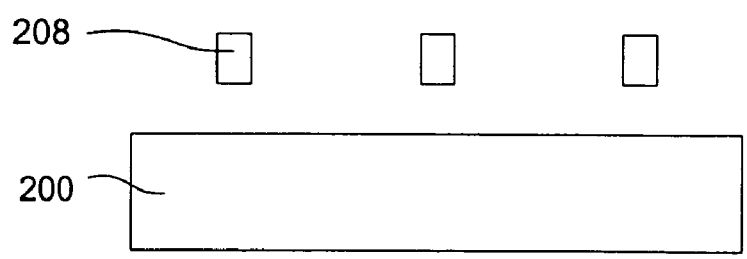

At step 132, the α-carbon second hard mask layer 216 is removed using, e.g., the process described above in reference to step 106 (FIGS. 2R, 2S). FIG. 2R depicts a cross-sectional view, and FIG. 2S depicts a top plan view of the substrate 200, respectively.

At step 134, the quantum dots 222 may be optionally isotropically etched to reduce topographic dimensions of the dots. In one exemplary embodiment, optional step 134 performs an etch process that is similar to described above in reference to step 114. Such a process may isotropically reduce topographic dimensions of the quantum dots 222 to about 20 nm or less.

At step 136, the barrier layer 202 may be optionally removed to release the quantum dots 222 from the substrate 200 for using the dots in non-semiconductor applications as, e.g., carriers of precursors, inhibitors, and the like in chemical reactions performed between liquid phase reactants (FIG. 2U). Generally, step 136 may use the etch process described above in reference to step 112.

In other applications, an InP, Si—Ge or Si quantum dot may be cladded in a dielectric material, such as $SiO_2$, to form an optical device, for example, a quantum semiconductor laser, an optical modulator or an optical detector. Such optical devices find use in telecommunication circuits, signal processing circuits, sensors, and the like. As such, in step 138, a decision is made if cladding is desired. If no cladding is desired, the method proceeds to step 142 where the method 100 ends. If cladding is desired, the method proceeds to step 140 where a cladding material is deposited over feature formed from the dot layer before ending the method at step 142. It is contemplated that the elongated feature formed after step 117 may be cladded to form an optical device.

Figure 3:
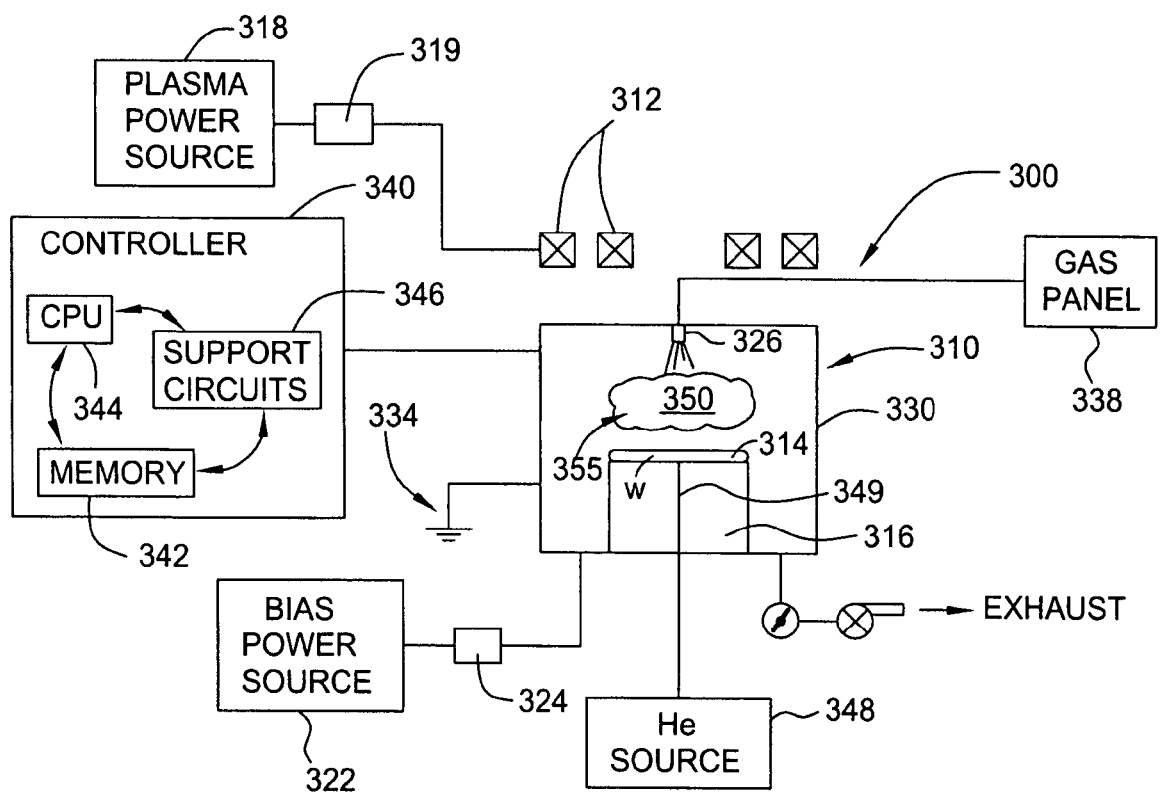
FIG. 3 depicts a schematic diagram of an exemplary plasma processing apparatus of the kind used in performing portions of the inventive method.

FIG. 3 depicts a schematic diagram of an etch reactor 300 that illustratively may be used to practice portions of the invention. As discussed above, one suitable etch reactor is a DPS® II etch reactor, available from Applied Materials, Inc., however, other etch reactors may be utilized. The reactor 300 comprises a process chamber 310 having a wafer support pedestal 316 within a conductive body (wall) 330, and a controller 340.

The chamber 310 is supplied with a substantially flat dielectric ceiling 320. Other modifications of the chamber 310 may have other types of ceilings, e.g., a dome-shaped ceiling. Above the ceiling 320 is disposed an antenna comprising at least one inductive coil element 312 (two co-axial elements 312 are shown). The inductive coil element 312 is coupled, through a first matching network 319, to a plasma power source 318. The plasma source 318 typically is capable of producing up to 3000 W at a tunable frequency in a range from 50 kHz to 13.56 MHz. For etch processing, the frequency is generally set to 13.56 MHz.

The support pedestal (cathode) 316 is coupled, through a second matching network 324, to a biasing power source 322. The biasing source 322 generally is a source of up to 500 W at a frequency of approximately 13.56 MHz that is capable of producing either continuous or pulsed power. In other embodiments, the source 322 may be a DC or pulsed DC source.

A controller 340 comprises a central processing unit (CPU) 344, a memory 342, and support circuits 346 for the CPU 344 and facilitates control of the components of the process chamber 310 and, as such, of the etch process, as discussed below in further detail.

In operation, a semiconductor wafer 314 is placed on the pedestal 316 and process gases are supplied from a gas panel 338 through entry ports 326 and form a gaseous mixture 350. The gaseous mixture 350 is ignited into a plasma 355 in the chamber 310 by applying power from the plasma and bias sources 318 and 322 to the inductive coil element 312 and the cathode 316, respectively. The pressure within the interior of the chamber 310 is controlled using a throttle valve 327 and a vacuum pump 336. Typically, the chamber wall 330 is coupled to an electrical ground 334. The temperature of the wall 330 is controlled using liquid-containing conduits (not shown) that run through the wall 330.

The temperature of the wafer 314 is controlled by stabilizing a temperature of the support pedestal 316. In one embodiment, the helium gas from a gas source 348 is provided via a gas conduit 349 to channels (not shown) formed in the pedestal surface under the wafer 314. The helium gas is used to facilitate heat transfer between the pedestal 316 and the wafer 314. During the processing, the pedestal 316 may be heated by a resistive heater (not shown) within the pedestal to a steady state temperature and then the helium gas facilitates uniform heating of the wafer 314. Using such thermal control, the wafer 314 is maintained at a temperature of between about 20 and 350 degrees Celsius.

To facilitate control of the process chamber 310 as described above, the controller 340 may be one of any form of general-purpose computer processor that can be used in an industrial setting for controlling various chambers and sub-processors. The memory, or computer-readable medium, 342 of the CPU 344 may be one or more of readily available memory such as random access memory (RAM), read only memory (ROM), floppy disk, hard disk, or any other form of digital storage, local or remote. The support circuits 346 are coupled to the CPU 344 for supporting the processor in a conventional manner. These circuits include cache, power supplies, clock circuits, input/output circuitry and subsystems, and the like. The inventive method is generally stored in the memory 342 as a software routine. The software routine may also be stored and/or executed by a second CPU (not shown) that is remotely located from the hardware being controlled by the CPU 344.

The invention may be practiced using other semiconductor wafer processing systems wherein the processing parameters may be adjusted to achieve acceptable characteristics by those skilled in the arts by utilizing the teachings disclosed herein without departing from the spirit of the invention.

Although the forgoing discussion referred to fabrication of the quantum dots, fabrication of the other devices and structures used in the integrated circuits and other applications can benefit from the invention. One particular advantage of the invention is that the quantum dots (or lines) are formed in predefined locations on the substrate. Another advantage is that the quantum dots (or lines) are formed at regular, repeatable intervals on the substrate.

While the foregoing is directed to the illustrative embodiment of the present invention, other and further embodiments of the invention may be devised without departing from the basic scope thereof, and the scope thereof is determined by the claims that follow.

What is claimed is:

1. A method of fabricating quantum features from a layer of material, comprising:
    forming a first hard mask having at least one elongated structure on the layer;
    laterally etching at least one elongated structure of the first hard mask prior to etching the layer;
    etching the layer through the first hard mask to form an elongated layer feature;
    removing the first hard mask;
    forming a second hard mask on the etched layer, the second hard mask having at least one elongated structure different orientation than the at least one elongated structure of the first hard mask;
    etching the etched layer through the second hard mask to form a plurality of quantum dots; and
    removing the second hard mask.

2. The method of claim 1, wherein the layer contains at least one material selected from materials identified in the III-V periodic groups.

3. The method of claim 1 further comprising:
    laterally etching the second hard mask prior to etching the etched layer.

4. The method of claim 1, wherein the elongated structures of first and second hard masks are orthogonally orientated.

5. The method of claim 1 further comprising:
    isotropically etching the quantum dots.

6. The method of claim 1, wherein the step of forming the first hard mask further comprises:
    forming a first elongated aperture and at least a second elongated aperture in the layer formed through the first mask, wherein a distance between the first and second apertures is about 110 nm.

7. The method of claim 1, wherein the step of forming the second hard mask further comprises:
    forming a first elongated aperture and at least a second elongated aperture in the layer formed through the second mask, wherein a distance between the first and second apertures is about 110 nm.

8. The method of claim 1, wherein the step of forming the first hard mask further comprises:
    forming a first elongated structure having a width of about 60 nm.

9. The method of claim 1, wherein the step of forming the first hard mask further comprises:
    forming a first elongated structure having a width of about 60 nm; and
    wherein the step of forming the second hard mask further comprises:
    forming a first elongated structure having a width of about 60 nm and an orientation different than the first elongated structure of the first hard mask.

10. The method of claim 1, wherein the step of etching the layer through the first hard mask layer further comprises:
    providing $CF_4$ and HBr at a flow ratio $CF_4$:HBr in a range from 1:20 to 2:1.

11. The method of claim 1, wherein the layer contains at least one material selected from lnP, Si—Ge and Si.

12. The method of claim 1 further comprising:
    depositing a cladding material on the quantum dots to form an optical device.

13. The method of claim 12, wherein the cladding is $SiO_2$.

14. The method of claim 12, wherein the optical device is a laser.

15. The method of claim 12, wherein the optical device is an optical modulator.

16. The method of claim 12, wherein the optical device is an optical detector.

17. The method of claim 1, wherein the elongated features are formed in a predefined location.

18. The method of claim 1, wherein the elongated features are formed a predefined pattern.

19. The method of claim 1, wherein the quantom dots are formed in a predefined location.

20. The method of claim 1, wherein the quantom dots are formed a predefined pattern.

21. A method of fabricating quantum dots on a substrate, comprising:
    (a) forming on the substrate a film stack comprising a first cap layer, a first hard mask layer, a layer of material selected from materials identified in the III-V periodic groups, and a barrier layer;
    (b) forming a first patterned mask having at least one elongated structure from on the first hard mask layer;
    (c) etching the first cap layer and the first hard mask layer;
    (d) laterally etching the first hard mask layer;
    (e) removing the first cap layer;
    (f) etching the layer of the material of the III-V periodic groups;
    (g) removing the first hard mask layer;
    (h) depositing a second hard mask layer on the etched layer of the material of the III-V periodic groups;
    (i) depositing a second cap layer on the second hard mask layer;
    (j) forming a second patterned mask having at least one elongated structure disposed in an orientation different than the at least one elongated structure of the first patterned mask on the second hard mask layer;
    (k) etching the second cap layer and the second hard mask layer;
    (l) laterally etching the second hard mask layer;
    (m) removing the second cap layer;
    (n) etching the etched layer of the material of the III-V groups; and
    (o) removing the second hard mask layer.

22. The method of claim 21 wherein said cap layers are layers of antireflective coating.

23. The method of claim 21 wherein said cap layers comprise material selected from at least one of an inorganic material, SiON, and $SiO_2$.

24. The method of claim 21 wherein the said hard mask layers comprise α-carbon.

25. The method of claim 21 wherein the said patterned masks are photoresist masks.

26. The method of claim 21 wherein said elongated structures are substantially parallel straight lines or walls.

27. The method of claim 21 wherein the step (b) further comprises:
    trimming the first patterned mask.

28. The method of claim 21 wherein the step (b) further comprises:
providing HBr and $O_2$ at a flow ratio HBr:$O_2$ in a range from 1:10 to 10:1.

29. The method of claim 21 wherein the step (c) further comprises:
removing the first patterned mask.

30. The method of claim 21 wherein the step (c) further comprises:
providing $CF_4$ and Ar at a flow ratio $CF_4$:Ar in a range from 1:10 to 10:1; and
providing HBr and $O_2$ at a flow ratio HBr:$O_2$ in a range from 1:2 to 20:1.

31. The method of claim 21 wherein the step (d) further comprises:
providing HBr and $O_2$ at a flow ratio HBr:$O_2$ in a range from 1:10 to 10:1.

32. The method of claim 21 wherein the steps (e) and (m) further comprise:
immersing the substrate in a solution comprising at least one of HF, $NH_4F$, $HNO_3$, and HCl.

33. The method of claim 21 wherein the steps (e) and (m) further comprise:
providing a solution comprising HF and $NH_4F$ in a volumetric ratio of about 1:6.

34. The method of claim 21 wherein the material of the III-V groups is Si.

35. The method of claim 21 wherein the steps (f) and (n) further comprise:
providing $CF_4$ and HBr at a flow ratio $CF_4$:HBr in a range from 1:20 to 2:1.

36. The method of claim 21 wherein the steps (g) and (o) further comprise:
providing HBr and $O_2$ at a flow ratio HBr:$O_2$ in a range from 1:10 to 10:1.

37. The method of claim 21 wherein the step (g) further comprises:
immersing the substrate in a solution of HF and deionized water.

38. The method of claim 21 wherein the step (j) further comprises:
trimming the second patterned mask.

39. The method of claim 21 wherein the step (j) further comprises:
providing HBr and $O_2$ at a flow ratio HBr:$O_2$ in a range from 1:10 to 10:1.

40. The method of claim 21 wherein the step (k) further comprises:
removing the second patterned mask.

41. The method of claim 21 wherein the step (k) further comprises:
providing $CF_4$ and Ar at a flow ratio $CF_4$:Ar in a range from 1:10 to 10:1; and
providing HBr and $O_2$ at a flow ratio HBr:$O_2$ in a range from 1:2 to 20:1.

42. The method of claim 21 wherein the step (o) further comprises
isotropically etching the quantum dots.

43. The method of claim 42 further comprising:
providing $CF_4$ and HBr at a flow ratio $CF_4$:HBr in a range from 1:20 to 2:1.

44. The method of claim 21 wherein the step (o) further comprises: etching the barrier layer.

45. The method of claim 44 further comprising:
immersing the substrate in a solution comprising at least one of HF, $NH_4F$, $HNO_3$, and HCl.

46. The method of claim 44 further comprising:
providing a solution comprising HF and $NH_4F$ in a volumetric ratio of about 1:6.

47. The method of claim 21 wherein said elongated structures are walls or lines having smallest widths of about 100 nm or less.

48. The method of claim 21 wherein the quantum dots are structures having topographic dimensions of about 20 nm or less.

49. The method of claim 21 wherein the quantum dots are disposed apart from one another using spaces of about 110 nm or greater.

50. The method of claim 21, wherein the layer contains at least one material selected from InP, Si—Ge and Si.

51. The method of claim 21 further comprising:
depositing a cladding material on the quantum dots to form an optical device.

52. The method of claim 51, wherein the cladding is $SiO_2$.

53. The method of claim 51, wherein the optical device is a laser.

54. The method of claim 51, wherein the optical device is an optical modulator.

55. The method of claim 51, wherein the optical device is an optical detector.

56. The method of claim 51, wherein the quantom dots are formed in a predefined location.

57. The method of claim 51, wherein the quantom dots are formed a predefined pattern.

* * * * *

UNITED STATES PATENT AND TRADEMARK OFFICE
CERTIFICATE OF CORRECTION

PATENT NO. : 7,250,319 B2
APPLICATION NO. : 10/825826
DATED : July 31, 2007
INVENTOR(S) : Liu et al.

It is certified that error appears in the above-identified patent and that said Letters Patent is hereby corrected as shown below:

On the Title page, item (57), in "Abstract", in column 2, line 3, delete "$I_nP$," and insert -- InP, --, therefor.

In column 6, line 9, delete "FIG. 21" and insert -- FIG. 2I --, therefor.

In column 6, line 11, after "step 106." insert -- The elongated features 220 have a distance about 110 nm or greater from one another. --.

In column 6, lines 21–29, delete "At step 116, the first hard mask layer 206 is removed. The cross-sectional and top plan views of the substrate 200 having the elongated features 220 (e.g., silicon elongated structures) formed on the barrier layer 202 are depicted in FIG. 21 and FIG. 2J, respectively. In one exemplary embodiment, to remove the .alpha.-carbon layer 206, step 116 may use the process described above in reference to step 106. The elongated features 220 have a distance about 110 nm or greater from one another." and
insert -- At step 118, if the method is being used for creating quantum dots, a second hard mask layer 216 and a second cap layer 218 are sequentially deposited over the elongated feature 220 and barrier layer 202 (FIG. 2K). Generally, the first and second hard mask layers 206, 216 and the first and second cap layers 208, 218 are correspondingly formed from same materials, e.g., α-carbon and silicon oxynitride, respectively. --, therefor.

In column 7, line 3, delete "(FIG. 20)" and insert -- (FIG. 2O) --, therefor.

In column 10, line 6, in Claim 11, delete "lnP," and insert -- InP, --, therefor.

In column 10, line 21, in Claim 19, delete "quantom" and insert -- quantum --, therefor.

In column 10, line 23, in Claim 20, delete "quantom" and insert -- quantum --, therefor.

In column 10, line 24, in Claim 20, after "formed" insert -- in --.

In column 10, line 32, in Claim 21, after "structure" delete "from".

In column 12, line 11, in Claim 42, after "comprises" insert -- : --.

In column 12, line 45, in Claim 56, delete "claim 51," and insert -- claim 21, --, therefor.

In column 12, line 45, in Claim 56, delete "quantom" and insert -- quantum --, therefor.

UNITED STATES PATENT AND TRADEMARK OFFICE
CERTIFICATE OF CORRECTION

PATENT NO. : 7,250,319 B2
APPLICATION NO. : 10/825826
DATED : July 31, 2007
INVENTOR(S) : Liu et al.

It is certified that error appears in the above-identified patent and that said Letters Patent is hereby corrected as shown below:

In column 12, line 47, in Claim 57, delete "claim 51," and insert -- claim 21, --, therefor.

In column 12, line 47, in Claim 57, delete "quantom" and insert -- quantum --, therefor.

Signed and Sealed this

Eleventh Day of December, 2007

JON W. DUDAS
*Director of the United States Patent and Trademark Office*